United States Patent
Hutin et al.

(10) Patent No.: US 9,911,827 B2
(45) Date of Patent: Mar. 6, 2018

(54) SBFET TRANSISTOR AND CORRESPONDING FABRICATION PROCESS

(71) Applicants: Commissariat a l'energie atomique et aux energies alternatives, Paris (FR); STMicroelectronics SA, Montrouge (FR); STMicroelectronics (Crolles 2) SAS, Crolles (FR)

(72) Inventors: Louis Hutin, Saint Martin le Vinoux (FR); Julien Borrel, Seyssinet (FR); Yves Morand, Grenoble (FR); Fabrice Nemouchi, Moirans (FR)

(73) Assignees: Commissariat A L'Energie Atomique et aux Energies Alternatives, Paris (FR); ST Microelectronics SA, Montrouge (FR); ST Microelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/372,930

(22) Filed: Dec. 8, 2016

(65) Prior Publication Data
US 2017/0162672 A1    Jun. 8, 2017

(30) Foreign Application Priority Data
Dec. 8, 2015 (FR) .................... 15 61963

(51) Int. Cl.
*H01L 29/66* (2006.01)
*H01L 29/78* (2006.01)
*H01L 29/08* (2006.01)

(52) U.S. Cl.
CPC .... *H01L 29/66643* (2013.01); *H01L 29/0895* (2013.01); *H01L 29/66636* (2013.01); *H01L 29/7839* (2013.01)

(58) Field of Classification Search
None
See application file for complete search history.

(56) References Cited

U.S. PATENT DOCUMENTS

| | | |
|---|---|---|
| 6,091,076 A | 7/2000 | Deleonibus |
| 2002/0011613 A1 | 1/2002 | Yagishita et al. |

(Continued)

FOREIGN PATENT DOCUMENTS

WO  WO 2007/109658 A2  9/2007

OTHER PUBLICATIONS

French Search Report (with Written Opinion) issued Apr. 4, 2016 in French Application 15 61963 filed on Dec. 8, 2015 (with English Translation of Categories of Cited Documents).

*Primary Examiner* — Asok K Sarkar
(74) *Attorney, Agent, or Firm* — Oblon, McClelland, Maier & Neustadt, L.L.P.

(57) ABSTRACT

A process for manufacturing a Schottky barrier field-effect transistor is provided. The process includes: providing a structure including a control gate and a semiconductive layer positioned under the gate and having protrusions that protrude laterally with respect to the gate; anisotropically etching at least one of the protrusions by using the control gate as a mask, so as to form a recess in this protrusion, this recess defining a lateral face of the semiconductive layer; depositing a layer of insulator on the lateral face of the semiconductive layer; and depositing a metal in the recess on the layer of insulator so as to form a contact of metal/insulator/semiconductor type between the deposit of metal and the lateral face of the semiconductive layer.

14 Claims, 6 Drawing Sheets

(56) References Cited

U.S. PATENT DOCUMENTS

| | | |
|---|---|---|
| 2002/0179980 A1 | 12/2002 | Yagishita et al. |
| 2005/0139860 A1 | 6/2005 | Snyder et al. |
| 2007/0026590 A1 | 2/2007 | Snyder et al. |
| 2010/0015802 A1 | 1/2010 | Snyder et al. |
| 2010/0320510 A1* | 12/2010 | Loh .................. H01L 21/28518 257/288 |
| 2012/0056250 A1 | 3/2012 | Snyder et al. |

* cited by examiner

SBFET TRANSISTOR AND CORRESPONDING FABRICATION PROCESS

The invention relates to field-effect transistors, and, in particular, to field-effect transistors with metal sources and drains, also referred to as Schottky barrier FET transistors.

Schottky barrier field-effect transistors have been developed as they exhibit a certain number of advantages, such as low-temperature manufacturing and decreased access resistances. The mode of operation of such a transistor is based on the modulation of the profile of the Schottky potential barrier between the source and the channel by means of the gate voltage. The current in the "on" state and the slope below the threshold are proportionally more favourable the smaller the lateral distance between the source/channel Schottky junction and the gate edge.

The manufacturing process of a Schottky barrier field-effect transistor assumes the formation of a contact between a metal drain or source electrode and a lateral face of a silicon channel. The performance of the transistor is particularly sensitive to the position of the interface between the metal source and the lateral face of the channel.

When the source encroaches under the gate, electrostatic control of the channel is not favoured and this leads to the occurrence of parasitic capacitances. Such parasitic capacitances greatly alter the high-frequency operation of the transistor.

When the source is set back with respect to the edges of the gate, the properties of the transistor in the open state are greatly altered, in particular due to the decrease in the efficiency of modulating the width of the Schottky barrier via the gate potential.

When the manufacturing process implements a heating step after metallizing the source or the drain, the position of the interface between this source and the channel is especially difficult to control. Specifically, all heating steps lead to a silicidation reaction occurring between the metal of the source and the silicon of the channel, forming an intermetallic compound, which actually moves the interface between the source and the channel under the gate.

Such heating steps are in particular implemented when annealing or when forming interconnections. In a Schottky barrier field-effect transistor, the performance in terms of current density in the "on" state and the amplitude of the leakage current in the open state are proportionally better the lower the resistance to the injection of carriers. Optimizing the operation of nFET and pFET transistors on one and the same integrated circuit is therefore difficult.

The document US2012/0056250 describes a manufacturing process of a Schottky barrier field-effect transistor. In this process, a step of isotropically etching a layer of silicon is implemented, which results in this silicon being hollowed out under gate spacers. Next, a layer of insulator is formed by oxidation or nitridation of the surface of the silicon layer. According to this process, the positioning and the thickness of the lateral insulator are poorly controlled, thereby leading to high levels of dispersion in the manufacturing process, and poor control of transistor performance. Furthermore, the possible composition for the lateral insulator is relatively limited.

The document U.S. Pat. No. 6,091,076 relates to a process for manufacturing a Schottky barrier field-effect transistor. In this process, a step of isotropically etching a layer of silicon is implemented, which results in this silicon being hollowed out under gate spacers as well as under the gate. Next, a layer of insulator is formed by oxidation or nitridation of the surface of the silicon layer. According to this process, the positioning and the thickness of the lateral insulator are poorly controlled, thereby leading to high levels of dispersion in the manufacturing process, and poor control of transistor performance. Furthermore, the possible composition for the lateral insulator is also relatively limited.

The document WO2007/109658 describes the formation of series transistor associations. Metal sources and drains are directly formed on a layer of oxide.

The invention aims to overcome one or more of these drawbacks. The invention thus pertains to a process for manufacturing a Schottky barrier field-effect transistor, such as defined in claim 1.

The invention also pertains to the variants of the dependent claims. Those skilled in the art will understand that each of the features of these variants may be combined independently with the features of claim 1, without actually constituting an intermediate generalization.

Other features and advantages of the invention will become clearly apparent from the description that is given thereof below, by way of non-limiting illustration, and with reference to the appended figures, in which.

A process for manufacturing a Schottky barrier field-effect transistor is proposed, comprising a contact of metal/insulator/semiconductor type, referred to as a MIS contact, between a conduction electrode (the source and/or the drain), i.e. the metal of the MIS contact, and a lateral face of its semiconductor channel region, i.e. the semiconductor portion of the MIS contact. The insulating portion of the MIS contact is an insertion made of an insulating material.

Such a transistor makes it possible to avoid the diffusion of the metal of the conduction electrode towards the semiconductor channel, due to the presence of the insulator separating them. The position of the contact with respect to the control gate is thus perfectly controlled, even when the manufacturing process comprises heating steps subsequent to the formation of this MIS contact. Furthermore, the electrical resistance of such an MIS contact favours an especially low level of resistance in the "on" state. Such a transistor manufactured according to the invention allows, in particular, a direct injection of the carriers of the conduction electrode into the channel of the transistor. The manufacturing process allows both the position and the thickness of the insulator to be perfectly controlled, in order to limit dispersions to the greatest possible extent.

Figure 18:
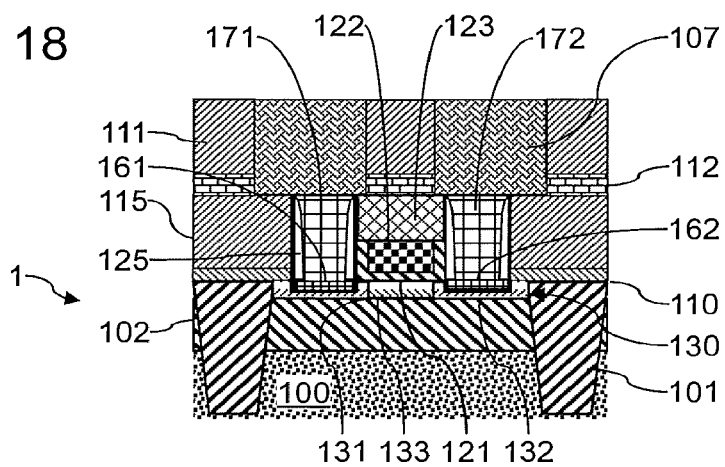

FIG. 18 is a cross-sectional view of an example of transistor 1, obtained according to a first example of embodiment of the invention, of FDSOI type in this instance. The transistor 1 comprises, in a manner known per se, a semiconductor substrate 100 surmounted by a buried layer of insulator 102.

The buried layer of insulator 102 is surmounted by a silicon-based semiconductive layer 130. The semiconductive layer 130 is typically referred to as the active layer. The semiconductive layer 130 comprises a weakly doped area 133 and two heavily doped areas 131 and 132. The heavily doped areas 131 and 132 will be referred to as extensions 131 and 132 throughout the rest of the text. A channel 134 (shown in more detail in the enlargement of FIG. 19)

includes, in this instance, the weakly doped area 133 and areas 137 and 138 which belong to the extensions 131 and 132, respectively. The areas 137 and 138 are positioned plumb with a control gate 12. The channel 134 is shown here within the rectangle of dotted lines illustrated in FIG. 19.

The transistor 1 comprises a gate stack positioned above the channel 134. The control gate 12 comprises, in this instance, a layer of gate insulator 121 and a gate electrode 122. The gate oxide 121 extends under the gate electrode 122 (between the gate electrode 122 and the channel 124) and may comprise, for example, walls extending across the lateral faces of the gate electrode 122, between the gate electrode 122 and spacers 125. An electrical insulator 123 for protecting the gate electrode 122 covers this gate electrode 122.

Spacers 125 are advantageously positioned on either side laterally with respect to the gate electrical insulator 121, with respect to the gate electrode 122 and with respect to the protective insulator 123. The spacers 125 are typically formed of $SiO_2$.

The extensions 131 and 132 comprise recesses. The lateral faces of the recesses of the extensions 131 and 132 are in the extension of lateral faces of the gate insulator 121 on one side, and in the extension of lateral faces of an encapsulation layer 115 on the other side. A layer of electrical insulator 150 covers 40 the lateral faces of the encapsulation layer 115, the lateral faces of the gate insulator 121, the lateral faces of the recesses of the extensions 131 and 132, and the bottom of the recesses. In particular, the layer of electrical insulator 150 covers the lateral face 135 of the extension 131 and the lateral face 136 of the extension 132. This portion 159 of the layer of electrical insulator forms an insulating insertion at the edge of the gate. The lateral faces 135 and 136 are formed in the extension of the gate insulator 121.

A metal source electrode 161 is formed in the recess of the extension 131. The source 161 is formed on the insulator 150. The source 161, the insulator 150 and the extension 131 form a contact of MIS type, allowing the contact resistance between the source 161 and the channel 134 to be optimally decreased, in particular at the lateral face 135 of the extension 131.

The presence of the insulator 150 also makes it possible to prevent the diffusion of the metal of the source 161 towards the channel 134 during the various potential heating steps of the manufacturing process. Thus, the precise position of the electrical contact between the source 161 and the channel 134 is perfectly controlled.

A metal drain electrode 162 is formed in the recess of the extension 132. The drain 162 is formed on the insulator 150. The drain 162, the insulator 150 and the extension 132 form a contact of MIS type, allowing the contact resistance between the drain 162 and the channel 134 to be optimally decreased, in particular at the lateral face 136 of the extension 132.

The MIS contacts are known per se and form an electrical connection by tunnelling. Those skilled in the art will know how to determine the thickness of the layer of insulator 150 to be used for forming a MIS contact. In particular, it will be possible to use the following properties for the layer of insulator 150:

For transistors with n-type channels, it will be possible, for example, to produce the electrical insulator 150 using $TiO_2$, ZnO, ITO, or $BaTiO_3$. The deposit of the electrical insulator 150 will typically potentially be 1 nm thick, for example a thickness of between 0.5 nm and 1.5 nm.

For transistors with p-type channels, it will be possible, for example, to produce the electrical insulator 150 using $Si_3N_4$ or $Al_2O_3$. The deposition of the electrical insulator 150 will typically potentially be 0.5 nm thick, for example a thickness of between 0.4 nm and 1.5 nm.

The presence of the insulator 150 also makes it possible to prevent the diffusion of the metal of the drain 162 towards the channel 134 during the various potential heating steps of the manufacturing process. Thus, the precise position of the electrical contact between the drain 162 and the channel 134 is perfectly controlled.

Figure 19:
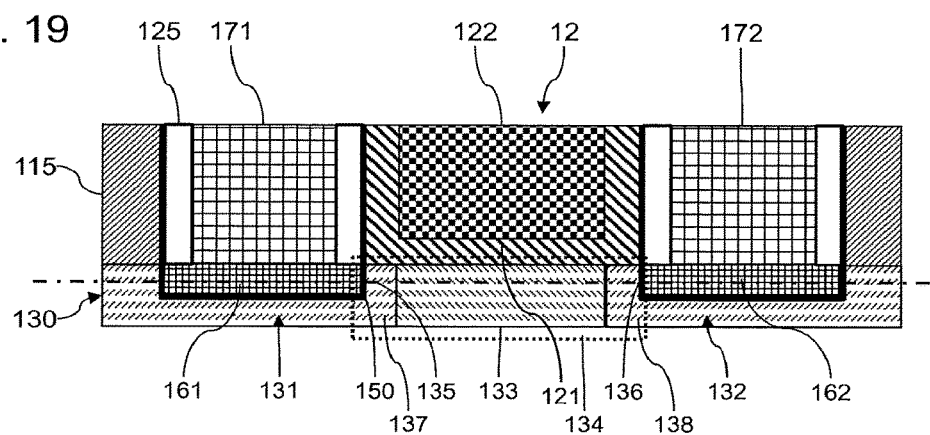
FIG. 19 is an enlarged view showing the interfaces between the channel and the source and drain of the transistor of the first embodiment.

As illustrated in FIG. 19, a plane P positioned under the control gate 12 may be traced by passing through the source 161, the drain 162, the channel 134 and the insulator 150. It may thus be considered that MIS contacts are formed that are coplanar with the source 161, the drain 162 and the channel 134.

Advantageously, in the example illustrated here, the source 161 and the drain 162 extend substantially up to the upper face of the channel 134, defined by the interface between this channel 134 and the gate insulator 121. Thus, the size of the MIS contact formed with the lateral face 135 of the extension 131 on one side, and the size of the MIS contact formed with the lateral face 136 of the extension 132 on the other side, is maximized.

Advantageously, in the example illustrated here, the source 161 and the drain 162 do not extend beyond the upper face of the channel 134. Thus, the parasitic capacitances formed between the control gate 12 and the source 161 and drain 162, respectively, are limited.

Advantageously, the sum of the thickness of the layer 150 and of the thickness of the source 161 is equal to the depth of the recess of the extension 131. Advantageously, the sum of the thickness of the layer 150 and of the thickness of the drain 162 is equal to the depth of the recess of the extension 132. The depths of the recesses of the extensions 131 and 132 will be denoted by Toe.

Advantageously, the extensions 131 and 132 have a level of doping that is at least 10 times higher than the level of doping of the area 133. Preferably, the doping concentration of the extensions 131 and 132 is at least equal to $10^{19}$ cm$^{-3}$, advantageously at least equal to $10^{20}$ cm$^{-3}$. Such a level of doping of the extensions 131 and 132 allows the quality of the obtained MIS contacts to be improved.

Advantageously, the extensions 131 and 132 extend under the source 161 and under the drain 162, respectively. Thus, MIS contacts are furthermore obtained under the source 161 and under the drain 162, thereby allowing their respective electrical contact areas with the channel 134 to be increased, in order to decrease the resistance in the "on" state of the transistor 1. Advantageously, a thickness of at least 1 nm, or even at least 2 nm, under the source 161 and/or the drain 162 is retained in order to favour a drop in the conduction resistance.

Advantageously, the MIS contact formed with the source 161 is positioned plumb with an edge of the control gate 12 in order to decrease, to the greatest possible extent, the conduction resistance of the transistor 1 in the "on" state. The MIS contact formed with the source 161 is, in this instance, positioned plumb with the edge of the gate insulator 121. It is also possible to envisage the MIS contact formed with the source 161 being positioned plumb with the edge of the gate electrode 122.

The channel 134 extends between the source 161 and the drain 162. For a transistor 1 of FDSOI type, the portion 133 of the channel 134 exhibits a level of doping that is typically lower than $5*10^{15}$ cm$^{-3}$, and typically of the order of $10^{15}$ cm$^{-3}$. The thickness of the channel 134 is, for example, between 5 and 15 nm.

Metal contacts 171 and 172 are positioned in each case plumb with the source 161 and the drain 162. The protective insulator 123 allows shorting between the gate electrode 122 and the contact 171 or the contact 172 to be avoided, even if these contacts 171 and 172 extend plumb with the gate stack. Thus, the operation of the transistor 1 is not altered by potential dispersions in the positioning of contacts 171 and 172 with respect to the gate stack. The positioning of the contacts 171 and 172 guarantees minimum distances between the channel 134 on one side and the source 161 and the drain 162 on the other side, thereby allowing the conduction resistance, and hence the access resistance of the transistor 1, to be decreased.

The height of the gate stack is, for example, between 10 and 100 nm, for example 30 nm.

The thickness of the gate insulator 121 is typically between 0.5 and 4 nm, preferably between 1 and 3 nm, for example 2 nm. The gate insulator 121 is, for example, made of silicon oxide, Hf oxide, or Zr oxide. In the configuration illustrated, the finer the gate insulator 121 is, the closer the MIS contact formed with the source 161 or the drain 162 is to being plumb with the edge of the gate electrode 122.

The gate electrode 122 exhibits, for example, a superposition of a layer of polysilicon (for example FG polysilicon chosen from among the group comprising NiSi, NiPtSi, NiCoSi, TiSi2 and WSi) and a metal layer (for example TiN) to achieve an integration of gate-first type, or, for example, a metal layer for an integration of gate-last type. The metal of the electrode 122 may, for example, be chosen from among the group including TiN, TiAlN or TaN.

Advantageously, the thickness of the protective insulator 123 is at least equal to half of the gate length Lg. The protective insulator 123 may, for example, be chosen from among the group comprising SiN, BN, SiBCN or SiBN.

The transistor 1 may be surrounded by isolation trenches 101 positioned on either side of the assembly comprising the source 161, the drain 162 and the gate stack. The isolation trenches 101 are used to isolate the transistor 1 from surrounding circuits. In this instance, the isolation trenches 101, commonly referred to by the acronym STI, pass through the buried insulating layer 102 and extend up to within the substrate 100. The isolation trenches 101 are, for example, made of silicon oxide.

An etch-stop layer 110 covers, in this instance, the edges of the semiconductive layer 130. The etch-stop layer 110 extends, in this instance, over the isolation trenches 101, and up to the upper portion of the semiconductive layer 130. The composition of the etch-stop layer 110 is known per se. The etch-stop layer 110 may, for example, be made of SiN. The thickness of this layer 110 may, for example, be between 5 nm and 100 nm, typically 20 nm.

The encapsulation layer 115 covers the etch-stop layer 110. The encapsulation layer 115 is typically made using an oxide of SiO$_2$. The encapsulation layer 115 is, in this instance, planarized to the same level as the electrical insulator 123. The transistor 1 additionally comprises, in this instance, an etch-stop layer 112 positioned on the gate stack and the encapsulation layer 115. The etch-stop layer 112 may, for example, be made of SiN. The thickness of this layer 112 may, for example, be between 5 nm and 100 nm, typically 20 nm.

An encapsulation layer 111 is positioned on the etch-stop layer 112. The encapsulation layer 111 may, for example, be made of silicon oxide or of a low-permittivity carbon-containing derivative. The thickness of the encapsulation layer 111 may, for example, be between 50 nm and 500 nm, typically 100 nm.

FIGS. 1 to 18 illustrate various steps of an example of a process for manufacturing a transistor 1, according to the first embodiment of the invention.

Figure 1:
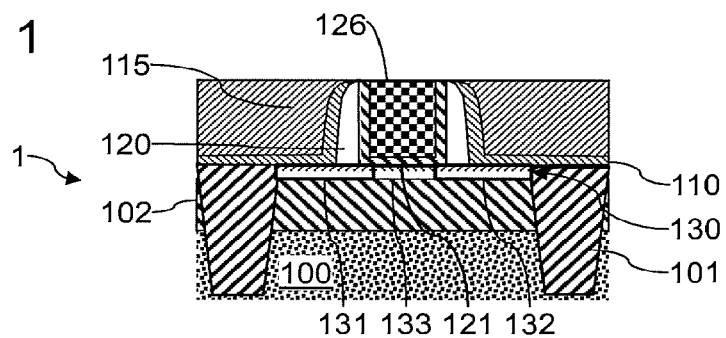
FIGS. 1 to 18 are schematic cross-sectional views of a transistor according to a first embodiment, at various steps of an example of a manufacturing process.

In one initial configuration illustrated in FIG. 1, a precursor component of the transistor 1 is shown, comprising: a substrate 100 such as described above, a buried insulating layer 102 such as described above, isolation trenches 101 such as described above, a semiconductive layer 130 such as described above, a gate stack comprising spacers 120, a gate conductor 126 and a gate insulator 121 such as described above. The gate oxide 121 extends under the gate conductor 126 and across the lateral faces of the gate conductor 126, between the gate conductor 126 and the spacers 120. The upper end of the gate conductor 126 is flush. An etch-stop layer 110 extends up to the upper end of the spacers 120. The etch-stop layer 110 is covered by an encapsulation layer 115.

The spacers 120 may be made of SiO$_2$. The width of the spacers 120 is advantageously at most equal to 7 nm. The spacers 120 serve, in particular, to laterally protect the gate conductor 126 and the gate oxide 121. The spacers 120 of the gate stack may also be used to localize the junction, for a prior implantation step for the purpose of forming the heavily doped areas 131 and 132, according to the illustrated variant.

Figure 2:
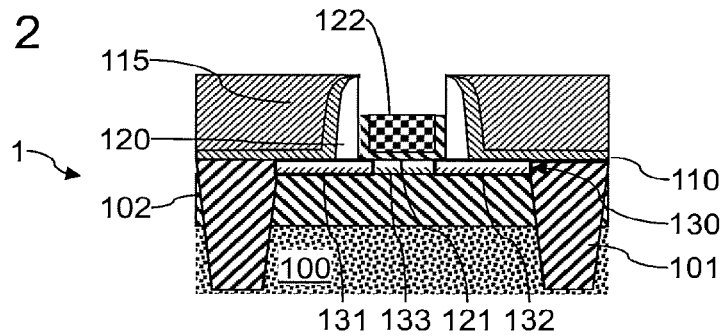

In the configuration of FIG. 2, an upper portion of the gate conductor 126 and of the gate insulator 121 is selectively partially removed in order to form the gate electrode 122 and delimit the height of the lateral walls of the gate insulator 121. The upper ends of the gate electrode 122 and of the gate insulator 121 are, in this instance, flush.

It is possible, for example, to envisage removing between 20 and 80% of the initial height of the gate conductor 126, for example 50% of this initial height, when forming the gate electrode 122.

The selective removal operation may be carried out via a partial wet etching step (for example using TMAH for polysilicon) or a partial dry etching step (for example using plasma). Such etching is selective with respect to the material of the spacers 120 or of the encapsulation layer 115, for example.

Optionally, and in the particular case of a gate conductor 126 made of FG polysilicon, the gate electrode 122 may undergo a silicidation step in order to form, for example, a silicide chosen from among the group comprising NiSi, NiPtSi, NiCoSi, TiSi$_2$ and WSi.

Figure 3:
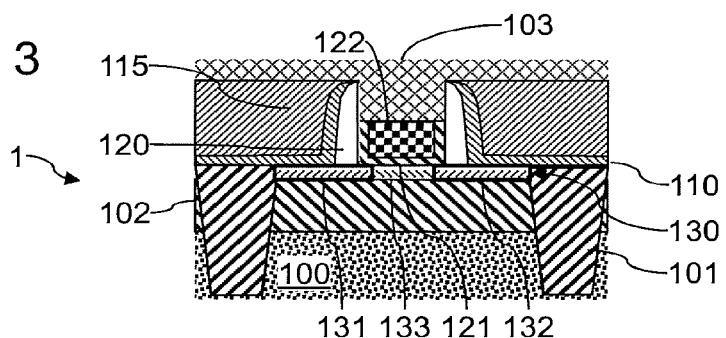

In the configuration of FIG. 3, a layer 103 of insulator is formed. The layer 103 in particular fills the volume removed from the gate conductor 126 in the selective removal step. The layer 103 may be formed by various processes, such as PECVD, LPCVD or ALD. The layer of insulator 103 may, for example, be made using a material chosen from among the group comprising SiN, BN, SiBCN or SiBN. In order to guarantee that the volume removed from the gate conductor 126 is filled in, the layer 103 is deposited so as to cover the encapsulation layer 115 in addition. The thickness of the deposited layer 103 is advantageously at least equal to the gate length.

Figure 4:
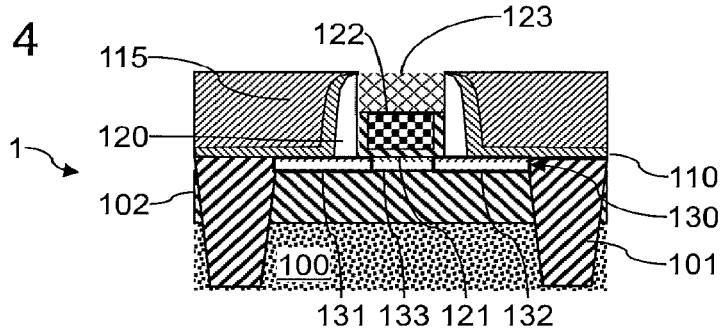

In the configuration of FIG. 4, the excess of the layer 103 is removed until the encapsulation layer 115 is uncovered. This removal operation is typically achieved via chemical-mechanical polishing (known as CMP in the literature). Such a polishing operation may advantageously be implemented selectively with respect to materials other than those of the layer 103. Upon completion of the removal operation, the layer 103 is retained only in the gate stack, a protective insulator 123 then being formed.

Figure 5:
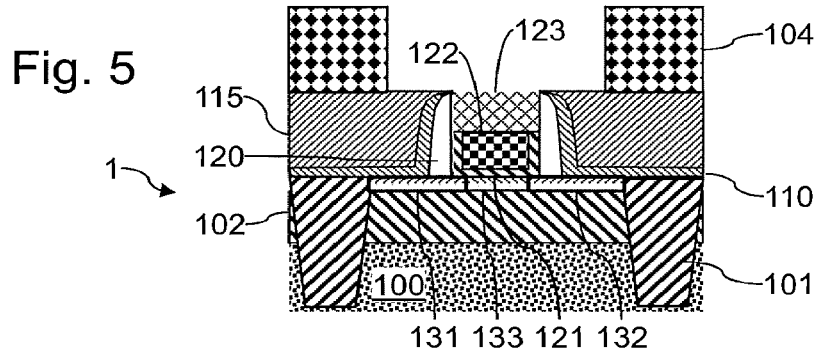

In the configuration of FIG. 5, a mask 104 is formed on the encapsulation layer 115, via photolithography of a resin, for example. The mask 104 is opened in order to uncover the gate stack and areas of the encapsulation layer 115 plumb with the extensions 131 and 132. The size of the opening made in the mask 104 by photolithography is relatively substantial with respect to the scale of the transistor 1 to be formed.

Figure 6:
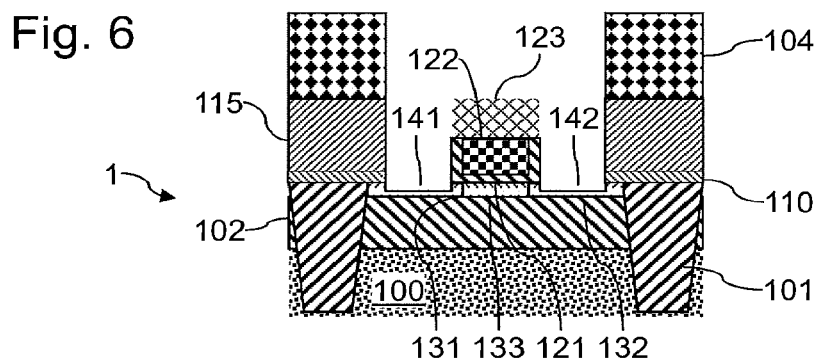

In the configuration of FIG. 6, the encapsulation layer 115 and the etch-stop layer 110 are removed plumb with the extensions 131 and 132 and plumb with the gate stack. This removal operation is carried out, in this instance, according to the pattern defined by the opening in the mask 104. The removal operation advantageously includes:

a first etching step, by selectively etching the encapsulation layer 115 with respect to the other materials (in particular the protective insulator 123). This etching operation is, for example, of the anisotropic type, and its properties are known per se by those skilled in the art. This etching operation is interrupted after having removed the encapsulation layer 115 plumb with the etch-stop layer 110;

a second etching step, by selectively etching the etch-stop layer 110 with respect to the other materials. This etching operation is, for example, of the anisotropic type, and its properties are known per se by those skilled in the art. Grooves are thus formed plumb with the extensions 131 and 132, between the encapsulation layer 115 and the spacers 120. The depth of said grooves is typically 20 nm. This etching operation is continued after having removed the etch-stop layer 110 from the extensions 131 and 132 and from the spacers 120 in order to hollow out recesses 141 and 142 in the thickness of the extensions 131 and 132, respectively. The position of the spacers 120 in contact with the lateral faces of the gate insulator 121 will make it possible to define the later placement of the MIS contacts to be formed. The depth of the recesses 141 and 142, which corresponds to the difference in thickness between the channel 134 and the extensions 131 and 132 at the recesses 141 and 142, will be denoted by Toe. The depth Toe may, for example, be between 7 and 11 nm. The etching operation is interrupted here before passing through the extensions 131 and 132 and reaching the layer of insulator 102.

As illustrated, the spacers 120 may advantageously be completely removed. The spacers 120 may also be partially removed, in order to define an uncovered length between the source (or drain) and the gate of the transistor 1.

Figure 7:
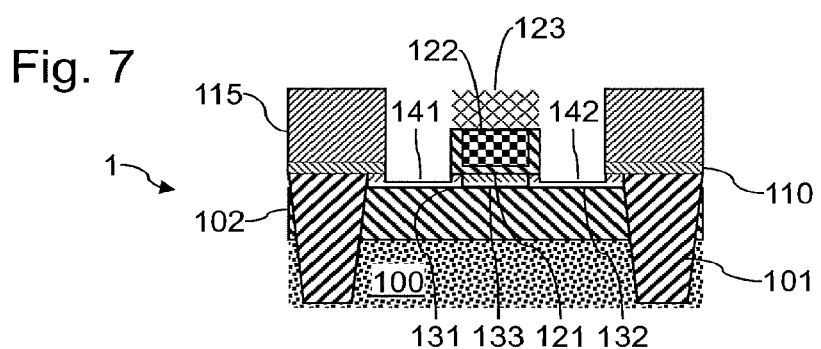

In the configuration of FIG. 7, the mask 104 is removed by a process known per se. The removal of the mask 104 uncovers the upper face of the encapsulation layer 115.

The process described with reference to FIGS. 1 to 5 is optional in the implementation of the embodiment of the invention. Characteristic steps of an example of process for manufacturing a transistor 1 according to the first embodiment of the invention are described with reference to FIGS. 6 to 18.

Figure 8:
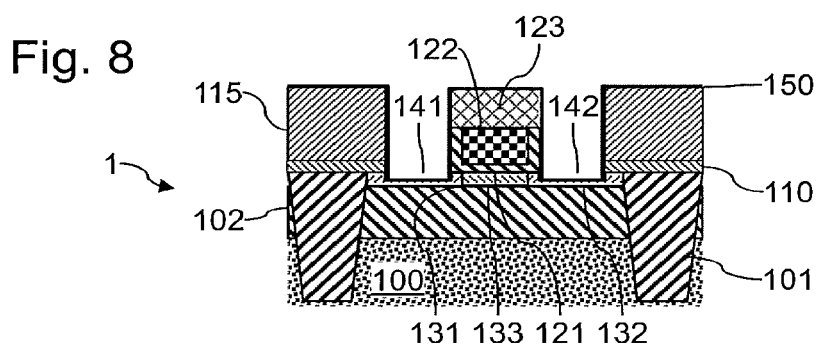

In the configuration of FIG. 8, the wafer-scale electrical insulator 150 is formed. The deposition of the electrical insulator 150 is carried out conformally or in a uniform manner. The electrical insulator 150 thus covers the upper face and the lateral faces of the gate stack, the extensions 131 and 132 up to their recesses 141 and 142, and the lateral and upper faces of the encapsulation layer 115. The electrical insulator 150 may be obtained either through the formation of a single insulating layer, or through the formation of a superposition of insulating layers. The electrical insulator 150 is, for example, deposited via an ALD process.

For transistors with n-type channels, it will be possible, for example, to produce the electrical insulator 150 using $TiO_2$, $ZnO$, $ITO$, or $BaTiO_3$. The deposition of the electrical insulator 150 will typically potentially be 1 nm thick, for example a thickness of between 0.5 nm and 1.5 nm.

For transistors with p-type channels, it will be possible, for example, to produce the electrical insulator 150 using $Si_3N_4$ or $Al_2O_3$. The deposition of the electrical insulator 150 will typically potentially be 0.5 nm thick, for example a thickness of between 0.4 nm and 1.5 nm.

Figure 9:
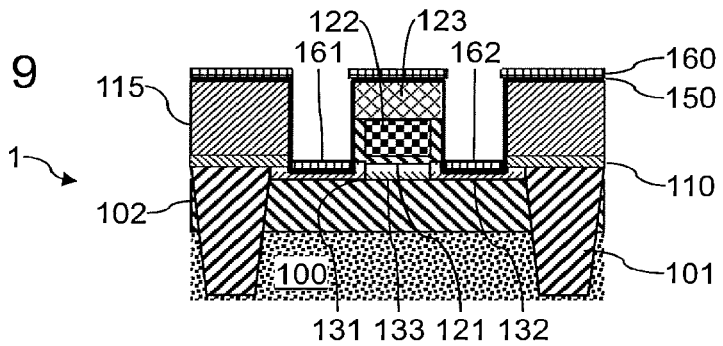

In the configuration of FIG. 9, a metal layer 160 is formed in a non-conformal or non-uniform manner. The non-uniform or non-conformal deposition may in particular be of PVD type. The non-uniform deposition may, for example, be carried out with a ratio between the thickness of deposition on the horizontal surfaces and the thickness of deposition on the vertical surfaces that is at least equal to 3. Due to the non-uniform or non-conformal deposition, the metal layer does not cover, or covers very little of, the lateral faces of the electrical insulator 150. The metal layer 160 covers the insulator 150 in the recesses 141 and 142 in particular, so as to form a source 161 and a drain 162. The layer 160 may be formed with a thickness that is substantially equal to Toe, such that the source 161 and the drain 162 fill their respective recesses, and such that the source 161 and the drain 162 are substantially flush with the upper face of the layer 130. The layer 160 may, for example, be deposited with a thickness of between 6 and 10 nm.

For transistors with n-type channels it will be possible, for example, to produce the metal layer 160 using Ti/TiN, Zr, or Hf, these materials being considered to have a low work function.

For transistors with p-type channels it will be possible, for example, to produce the metal layer 160 using Pt or Au, these materials being considered to have a high work function.

The deposition of the layer 160 may potentially be followed by an isotropic etching operation intended to remove any potential residual layer 160 from the lateral faces of the layer of insulator 150.

The layer 160 may potentially be deposited such that it protrudes beyond the recesses of the extensions 131 and 132, then the layer 160 is partially removed until the source 161 and the drain 162 are flush with the upper face of the layer 130.

Due to the source 161 and the drain 162 being formed on the basis of the deposition of a metal layer 160, the source 161 and the drain 162 potentially being deposited without making use of epitaxial growth, thereby avoiding a heating step in the manufacturing process.

Figure 10:
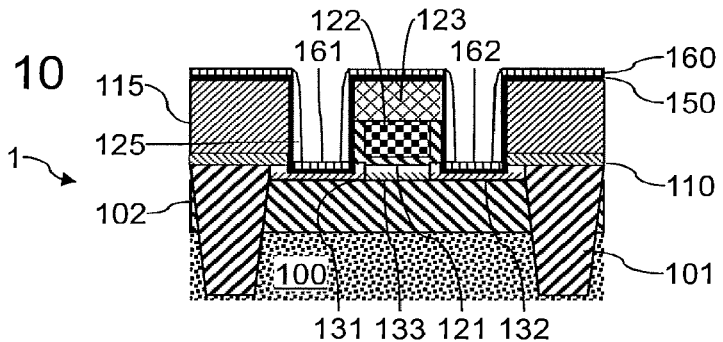

In the configuration of FIG. 10, spacers 125 are formed in the cavities plumb with the source 161 and the drain 162. The spacers 125 may, for example, be formed using materials with low permittivity coefficients, for example a material chosen from among the group comprising SiBCN, BN or SiOC. Spacers 125 are in particular formed against the lateral faces of the gate insulator 121 and on the lateral faces of the encapsulation layer 115. The spacers 125 formed are intended to decrease the parasitic capacitances between the gate 12 and the source and drain contacts to be formed. The spacers 125 also serve to increase resistance to breakdown between the source and gate or between the drain and gate. Spacers 125 prove to be particularly advantageous for one variant of the manufacturing process, of gate-first type, in which the gate does not comprise any gate insulator walls 121 on the sides of the gate electrode 122. The thickness of the spacers 125 is advantageously at most equal to half of the thickness of the lateral wall of the gate oxide 121.

Figure 11:
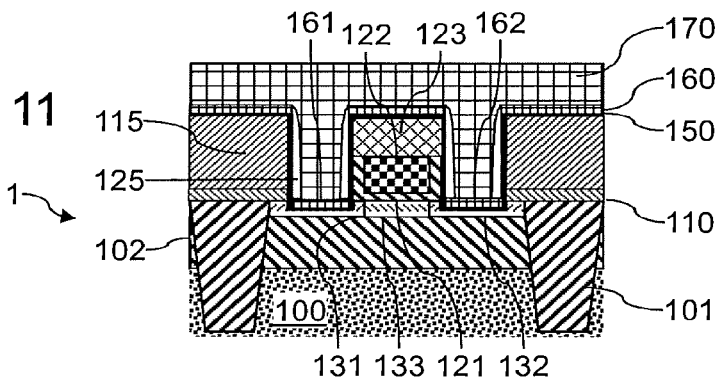

In the configuration of FIG. 11, a wafer-scale metal layer 170 is formed in order to cover the layer 160 and fill the grooves made plumb with the source 161 and the drain 162. Metal contacts 171 and 172 are thus formed on the source 161 and the drain 162, respectively.

The metal layer 170 may include one or more superposed layers of different metals. The one or more metals of these layers may, for example be chosen from among the group comprising TiN, TaN, TiAlN, W or Cu. The total thickness of the metal layer 170 may, for example, be between 20 and 500 nm, typically 100 nm.

Figure 12:
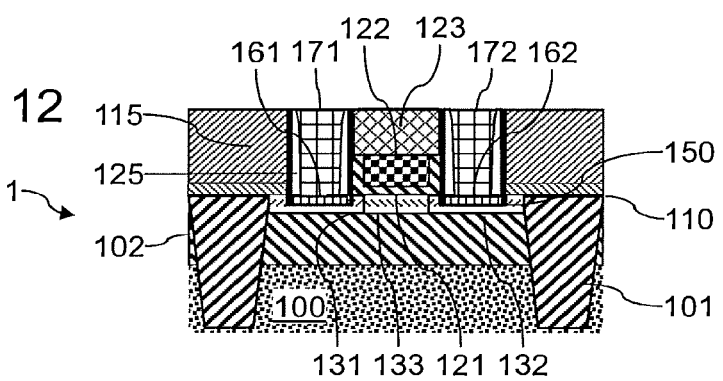

In the configuration of FIG. 12, the excess of the layer 170, a portion of the layer 160 and a portion of the insulating layer 150 are removed until the upper face of the encapsulation layer 115 is uncovered and until the protective insulator 123 is uncovered. Shorting between the metal contacts 171 and 172 above the gate stack is thus avoided.

This removal operation is typically achieved via chemical-mechanical polishing (known as CMP in the literature). A thickness of protective insulator 123 that is sufficient to guarantee the absence of shorting between the gate electrode 122 and the source and drain contacts 171 and 172 is also retained.

Figure 13:
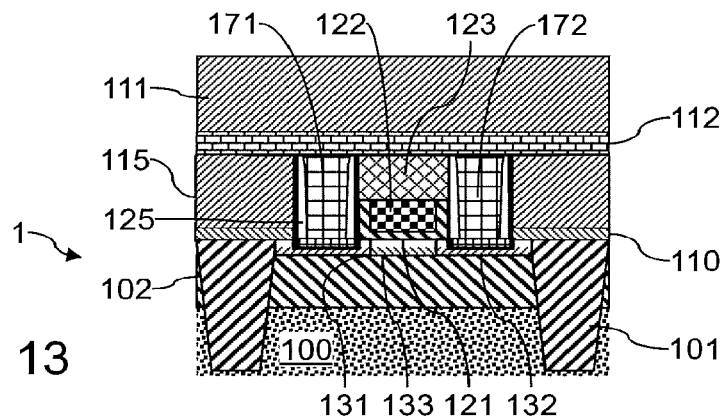

In the configuration of FIG. 13, the following have been formed:
- a wafer-scale etch-stop layer 112. The etch-stop layer 112 is typically made of SiN, with a thickness of between 5 and 100 nm, typically 20 nm; and
- a wafer-scale encapsulation layer 111 on the etch-stop layer 112. The encapsulation layer 111 is, for example, made of $SiO_2$ of PMD type, or of a low-permittivity carbon-containing derivative material. The thickness of the encapsulation layer 111 is typically between 50 nm and 500 nm, typically 100 nm.

Figure 14:
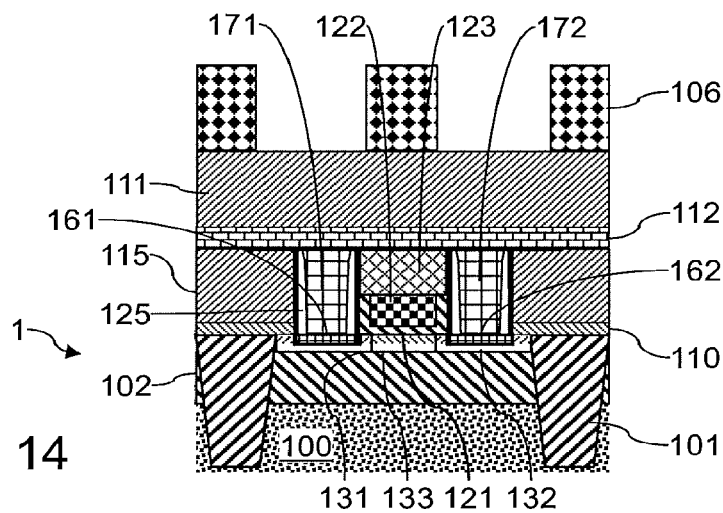

In the configuration of FIG. 14, a mask 106 is formed on the encapsulation layer 111, via photolithography of a resin, for example. The mask 106 is opened in order to uncover the encapsulation layer 111 plumb with the source 161 and the drain 162. The openings are wider than the source and the drain, so as to facilitate their positioning plumb with the source and the drain, even with lower photolithography tolerances. The dispersions in the positioning of the openings in the mask 106 with respect to the source 161 and the drain 162 may be relatively high (for example of the order of 0.5*Lg) without altering the operation of the transistor 1, due to the possibility of being able to subsequently deposit the metal of a contact on the protective insulator 123 without the risk of creating a short circuit.

Figure 15:
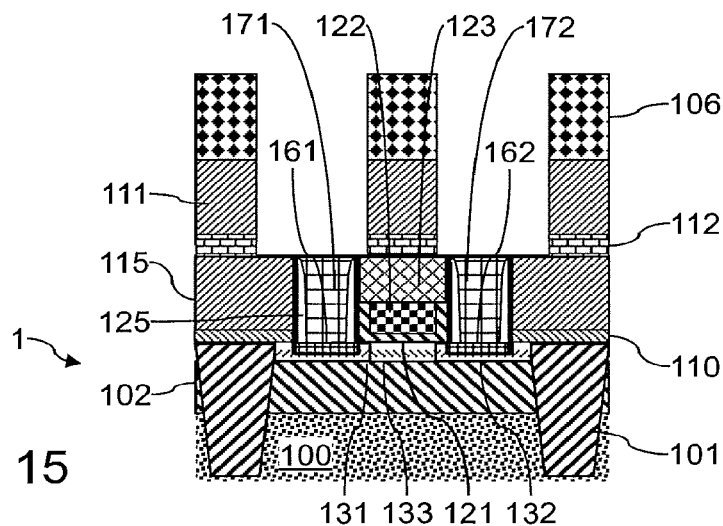

In the configuration of FIG. 15, the encapsulation layer 111 and the etch-stop layer 112 are removed plumb with the source 161 and the drain 162. This removal operation is carried out, in this instance, according to the pattern defined by the openings in the mask 106. Due to the openings in the mask 106 being wider than the source 161 and the drain 162, the removal operation in this instance uncovers, in particular, a portion of the upper surface of the encapsulation layer 115 and/or a portion of the protective insulator 123.

The removal operation advantageously includes:
- a first etching step, by selectively etching the encapsulation layer 111 with respect to the other materials (in particular the material of the etch-stop layer 112). This etching operation is, for example, of the anisotropic type, and its properties are known per se by those skilled in the art. This etching operation is interrupted after having removed the encapsulation layer 111 plumb with the etch-stop layer 112;
- a second etching step, by selectively etching the etch-stop layer 112 with respect to the other materials. This etching operation is, for example, of the anisotropic type, and its properties are known per se by those skilled in the art. This etching operation is interrupted after having removed the etch-stop layer 112 up to the contacts 171 and 172. Grooves are thus formed plumb with the contacts 171 and 172, and, in this instance, plumb with a portion of the encapsulation layer 115, the spacers 125 and, potentially, a portion of the protective insulator 123.

Figure 16:
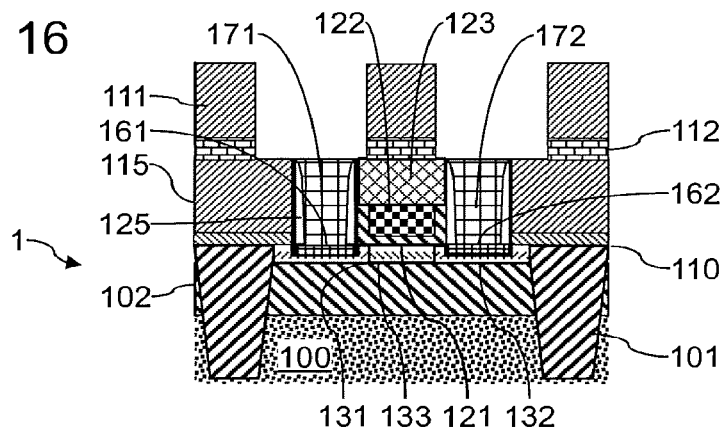

In the configuration of FIG. 16, the mask 106 is removed by a process known per se. The removal of the mask 106 uncovers the upper face of the encapsulation layer 111.

Figure 17:
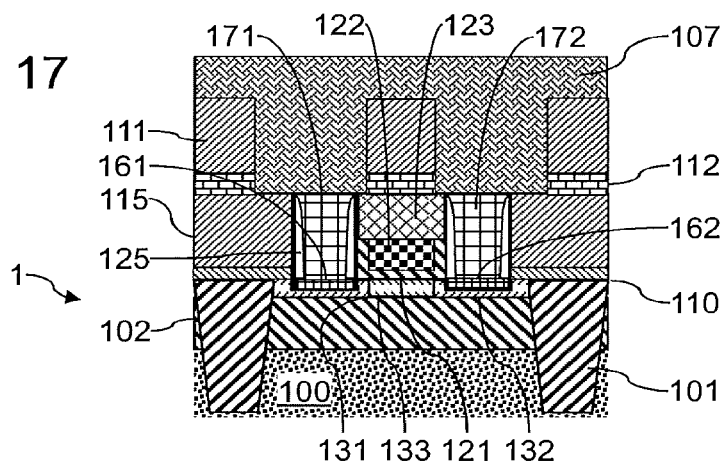

In the configuration of FIG. 17, a wafer-scale metal layer 107 is formed in order to cover the various areas and fill the grooves made plumb with the contacts 171 and 172 above the metal that is already present. The metal layer 107 formed thus makes contact with the contacts 171 and 172 and allows electrical conduction with these contacts. Although not illustrated, the metal layer is also advantageously formed in contact with the gate electrode.

The metal layer 107 may include one or more superposed layers of different metals. The one or more metals of these layers may, for example be chosen from among the group comprising TiN, TaN, TiAlN, W or Cu. In the variant illustrated in FIG. 17, the material of the metal layer 107 is different to the metal already present.

Via a step of removing the excess of the metal layer 107 until the upper face of the encapsulation layer 111 is uncovered, the structure illustrated in FIG. 18 is obtained. This removal operation is typically achieved via chemical-mechanical polishing (known as CMP in the literature). The contacts 171 and 172 are thus complete.

The thickness of the contacts 171 and 172 obtained upon completion of this removal step may typically be between 20 and 500 nm, for example 100 nm.

Interconnection steps known per se may subsequently be implemented in order to connect the contacts 171 and 172 of the transistor 1 to other circuits.

Particularly in the absence of implantation in the channel 134 (i.e. when the extensions 131 and 132 exhibit the same level of doping as the area 133), it is possible not to form spacers 125 on either side of the gate stack or against the lateral faces of the encapsulation layer 115.

In the example illustrated, the extensions 131 and 132 are advantageously formed beforehand via ion implantation. It is also possible to envisage forming grooves up to contact with the insulating layer 102 or up to within a uniformly doped layer 130 including the extensions 131 and 132, then depositing a heavily doped layer, via epitaxy, within the grooves formed. The recesses of the extensions 131 and 132 may be formed later by etching.

In the example illustrated, the spacers 120 have advantageously been removed before forming the recesses in the extensions 131 and 132. In particular, when the width of the spacers 120 is at most equal to 7 nm, it is also possible to envisage retaining these spacers 120, even if it means slightly increasing the distance between the gate 12 and the source 161 or drain 162.

Figure 20:
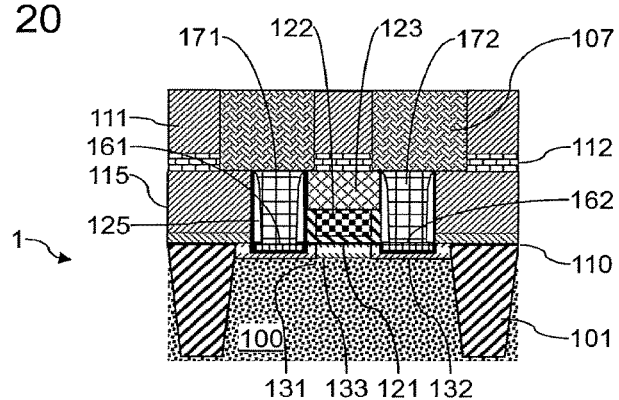
FIG. 20 is a schematic cross-sectional view of a transistor according to a second embodiment.

FIG. 20 is a cross-sectional view of an exemplary transistor 1 obtained according to an example of a second embodiment of the invention, in this instance for a transistor of bulk-substrate type. The transistor 1 is distinguished from that illustrated in FIG. 18 solely by the absence of the buried layer of insulator 102. The invention may also be applied to FINFETs.

The invention claimed is:

1. A process for manufacturing a Schottky barrier field-effect transistor, comprising steps of:
providing a structure comprising a control gate and a semiconductive layer positioned under the control gate and having protrusions that protrude laterally beyond sides of the control gate;
anisotropically etching at least one of said protrusions by using the control gate as a mask, so as to form a recess in the at least one protrusion, the recess defining at least one lateral face of said semiconductive layer disposed laterally beyond the sides of the control gate;
depositing a layer of insulator on said at least one lateral face of said semiconductive layer; and
depositing a metal on the layer of insulator in the recess so as to form a contact of metal/insulator/semiconductor type between the metal and said at least one lateral face of said semiconductive layer.

2. The process for manufacturing a Schottky barrier field-effect transistor according to claim 1, wherein a height of said formed contact of the metal/insulator/semiconductor type is at least equal to 6 nm on said at least one lateral face of the semiconductive layer.

3. The process for manufacturing a Schottky barrier field-effect transistor according to claim 1, further comprising steps of:
anisotropically etching another of said protrusions by using the control gate as a mask, so as to form another recess in the another protrusion, the another recess defining another lateral face of said semiconductive layer disposed laterally beyond the sides of the control gate;
depositing the layer of insulator on said another lateral face of said semiconductive layer; and
depositing the metal on the layer of insulator in the another recess of said another protrusion so as to form another contact of metal/insulator/semiconductor type between the metal and said another lateral face of said semiconductive layer.

4. The process for manufacturing a Schottky barrier field-effect transistor according to claim 3, wherein a geometric plane passes under the control gate, passes through said deposited metal, passes through said deposited layers of insulator, and passes through an area of the semiconductive layer.

5. The process for manufacturing a Schottky barrier field-effect transistor according to claim 1, wherein a thickness of said deposited layer of insulator is between 0.5 nm and 3 nm and separates the metal from said semiconductive layer.

6. The process for manufacturing a Schottky barrier field-effect transistor according to claim 1, wherein said deposited layer of insulator includes a material chosen from among the group comprising $TiO_2$, $ZnO$, $ITO$, $BaTiO_3$, $Si_3N_4$, and $Al_2O_3$.

7. The process for manufacturing a Schottky barrier field-effect transistor according to claim 1, wherein said deposited metal includes a metal chosen from among the group comprising Ti, TiN, Zr, Hf, Pt, and Au.

8. The process for manufacturing a Schottky barrier field-effect transistor according to claim 1, wherein said control gate comprises a gate metal and a gate insulator positioned under and on sides of said gate metal.

9. The process for manufacturing a Schottky barrier field-effect transistor according to claim 1, wherein said at least one lateral face of said semiconductive layer is formed in the at least one protrusion having an implantation of dopants.

10. The process for manufacturing a Schottky barrier field-effect transistor according to claim 9, wherein the at least one protrusion has a doping concentration of at least equal to $10^{19}$ cm$^{-3}$.

11. The process for manufacturing a Schottky barrier field-effect transistor according to claim 1, further comprising forming an insulating spacer on the sides of the control gate and plumb with said deposited metal.

12. The process for manufacturing a Schottk bairier field-effect transistor according to claim 11, wherein the layer of insulator is also deposited on a lateral face of the sides of the control gate, said insulating spacer being formed on the layer of insulator deposited on the lateral face of the sides of the control gate.

13. The process for manufacturing a Schottky barrier field-effect transistor according to claim 11, wherein said insulating spacer is formed plumb with the metal deposited in said recess.

14. The process for manufacturing a Schottky barrier field-effect transistor according to claim 1,
wherein the depositing the layer of insulator further comprises depositing the layer of insulator on an upper surface of the recess in the at least one protrusion, and
wherein the deposited layer of insulator prevents the deposited metal from physically contacting the semiconductive layer in the recess.

* * * * *